US005386206A

United States Patent [19]

Iwatani et al.

[11] Patent Number: 5,386,206

[45] Date of Patent: Jan. 31, 1995

[54] LAYERED TRANSFORMER COIL HAVING CONDUCTORS PROJECTING INTO THROUGH HOLES

[75] Inventors: Hidetoshi Iwatani; Masakazu Kazama; Masato Fujino, all of Kyoto, Japan

[73] Assignee: Murata Manufacturing Co., Ltd., Japan

[21] Appl. No.: 955,837

[22] Filed: Oct. 2, 1992

[30] Foreign Application Priority Data

Oct. 3, 1991 [JP] Japan ................................ 3-256798

[51] Int. Cl.$^6$ ............................................ H05K 1/11

[52] U.S. Cl. ...................................... 336/200; 336/83; 336/232; 174/261

[58] Field of Search ......................... 336/200, 232, 83; 174/261

[56] References Cited

U.S. PATENT DOCUMENTS

| | | | |
|---|---|---|---|
| 3,792,059 | 3/1974 | Astle et al. | 336/200 X |
| 4,183,074 | 1/1980 | Wallace | 336/200 X |
| 4,342,143 | 8/1982 | Jennings | 336/200 X |
| 4,914,561 | 4/1990 | Rice et al. | 336/200 X |
| 5,126,971 | 6/1992 | Lin et al. | 336/200 X |

FOREIGN PATENT DOCUMENTS

| | | | |
|---|---|---|---|
| 0013460 | 7/1980 | European Pat. Off. . | |
| 0013782 | 8/1980 | European Pat. Off. . | |
| 28947 | 3/1884 | Germany . | |
| 0906831 | 7/1953 | Germany . | |
| 1614522 | 8/1970 | Germany . | |
| 59-58805 | 4/1984 | Japan | 336/200 |
| 0715226 | 9/1954 | United Kingdom . | |
| 2031656 | 4/1980 | United Kingdom . | |
| 2223624 | 4/1990 | United Kingdom . | |

OTHER PUBLICATIONS

Condenser Type Spot Welding Machines, May 1, 1989, Kimura Denyoki, Ltd.

Inverter DC Welder, May 1, 1988, Kimura Denyoki, Ltd.

JP 2-202 007 Patents Abstracts of Japan, Oct. 24, 1990, vol. 14/No. 489.

JP 59-58 805 Patents Abstracts of Japan, Jul. 19, 1984, vol. 8/No. 155.

JP 3-212 913 Patents Abstracts of Japan, Dec. 11, 1991, vol. 15/No. 490.

JP 59-58 806 Patents Abstracts of Japan, Jul. 19, 1984, vol. 8/No. 155.

JP 58-139 410 Patents Abstracts of Japan, Nov. 8, 1983, vol. 7/No. 251.

German Patent Office Action dated Jan. 28, 1994.

*Primary Examiner*—Leo P. Picard
*Assistant Examiner*—L. Thomas
*Attorney, Agent, or Firm*—Ostrolenk, Faber, Gerb & Soffen

[57] ABSTRACT

A layered coil, having high connection reliability, formed by alternately stacking a plurality of coil conductors and insulators. Outlet portions of the of coil conductors are connected with each other without using through holes. The coil conductors are formed on surfaces of insulating sheets so that the outlet portions of the coil conductors project from edges of the insulating sheets. The insulating sheets are stacked so that the outlet portions of the coil conductors can be connected, by spot welding or the like, with each other or with terminals in portions projecting from surfaces of the layered product.

19 Claims, 6 Drawing Sheets

LAYERED TRANSFORMER COIL HAVING CONDUCTORS PROJECTING INTO THROUGH HOLES

BACKGROUND OF THE INVENTION

1. Field of the Invention

The present invention relates to a layered coil which is applicable to various types of electronic circuits, and a method of manufacturing the same.

2. Description of the Background Art

In order to manufacture a layered coil, a plurality of insulating sheets, which are provided with spiral coil conductors on surfaces thereof, are generally stacked with each other so that the coil conductors are connected in series or parallel to each other via through holes provided in the insulating sheets.

However, it takes much time to provide such through holes in the insulating sheets, and hence the cost is increased. Particularly in a heavy-current layered coil, a lot of time is required for connecting coil conductors with each other due to the large number of insulating sheets. Some of the coil also conductors are connected with terminals via through holes. However, such connections are unreliable so that resistance values are easily increased in the connected portions.

SUMMARY OF THE INVENTION

Accordingly, an object of the present invention is to provide a layered coil having high connection reliability, whereby outlet portions of coil conductors are connected with each other using no through holes, and a method of manufacturing the same.

In order to solve the aforementioned problem, the layered coil according to the present invention is characterized in that outlet portions of coil conductors projecting from surfaces of a layered product, which is formed by the coil conductors and insulators, are connected with each other.

According to the present invention, outlet portions of coil conductors project from surfaces of a layered product which is formed by the coil conductors and insulators, whereby the same can be easily connected with each other. Further, the outlet portions are directly connected with each other or with terminals by spot welding, soldering or the like, whereby it is possible to prevent the increase of resistance values caused by such connection. Thus, a layered coil having high connection reliability can be obtained using no through holes.

A method of manufacturing a layered coil according to the present invention comprises:

(a) a step of preparing a plurality of insulating sheets having prescribed shapes;

(b) a step of superposing conductor sheets, having portions outwardly extending beyond the insulating sheets, on the insulating sheets;

(c) a step of partially removing the conductor sheets to obtain coil conductors, having outlet portions projecting from edges of the insulating sheets, from the conductor sheets;

(d) a step of stacking the plurality of insulating sheets provided with the coil conductors respectively for obtaining a layered product; and (e) a step of connecting specific ones of the outlet portions projecting from surfaces of the layered product with related ones of the outlet portions.

A method of manufacturing a layered coil according to another aspect of the present invention comprises:

(a) a step of forming coil conductors, having outlet portions on both end portions thereof, on a plurality of insulating sheets respectively;

(b) a step of removing parts of the insulating sheets in portions provided with the outlet portions thereby making the outlet portions project from edges of the insulating sheets;

(c) a step of stacking the plurality of insulating sheets provided with the coil conductors respectively to obtain a layered product; and (d) a step of connecting specific ones of the outlet portions projecting from surfaces of the layered product with related ones of the outlet portions.

As hereinabove described, unnecessary portions are removed from the conductor sheets which are superposed on the insulating sheets, or parts of the insulating sheets are removed from portions provided with the outlet portions of the coil conductors. Thus, it is possible to easily obtain insulating sheets so that the outlet portions of the coil conductors project from the edges of the insulating sheets.

When insulating sheets with outlet portions of coil conductors jutting from edges thereof are stacked with each other so that the outlet portions are connected with each other, or preferably are further connected with terminals, by means of spot welding or the like, it is possible to easily manufacture a layered coil using no through holes.

The foregoing and other objects, features, aspects and advantages of the present invention will become more apparent from the following detailed description of the embodiments of the present invention when taken in conjunction with the accompanying drawings.

DESCRIPTION OF THE PREFERRED EMBODIMENTS

Figure 1:
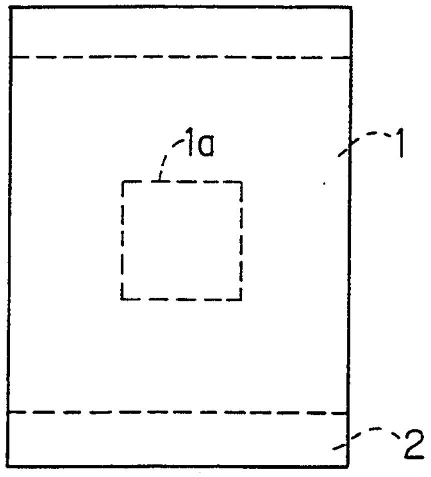
FIG. 1 is a plan view illustrating a method of preparing an insulating sheet which is employed for a layered coil according to a first embodiment of the present invention.
Figure 2:
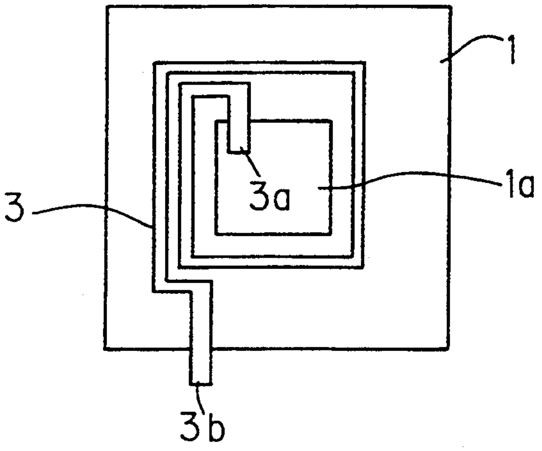
FIG. 2 is a plan view further illustrating the method of preparing the insulating sheet shown in FIG. 1.

Some layered coils according to preferred embodiments of the present invention and methods of manufacturing the same are now described with reference to the accompanying drawings. Throughout the specification, similar components and portions are denoted by the same reference numerals.

First Embodiment (FIGS. 1 to 6)

A layered coil according to a first embodiment of the present invention has a cored structure. As shown in FIG. 1, an insulating sheet 1 is punched into prescribed dimensions. A hole 1*a* is formed in its central portion. This insulating sheet 1 is prepared from a polyimide substrate of 25 μm in thickness, for example. A metallic sheet 2 of copper, for example, having a thickness of 35 to 105 μm, for example, is stuck onto the upper surface of the insulating sheet 1 through a bonding layer. Opposite end portions of the metallic sheet 2 project from outer peripheral portions of the insulating sheet 1. In order to obtain a desired spiral coil conductor, a resist film is formed on the surface of the metallic sheet 2. The resist film is subjected to etching for removing unnecessary portions of the metallic sheet 2. Then the resist film is removed so as to obtain the insulating sheet 1 which is thereby provided with a coil conductor 3 on its surface. A first outlet portion 3*a* of the coil conductor 3 projects from an edge of the hole 1*a*, while a second outlet portion 3*b* of the coil conductor's projects from an outer peripheral portion of the insulating sheet 1 (see FIG. 2).

Figure 3:
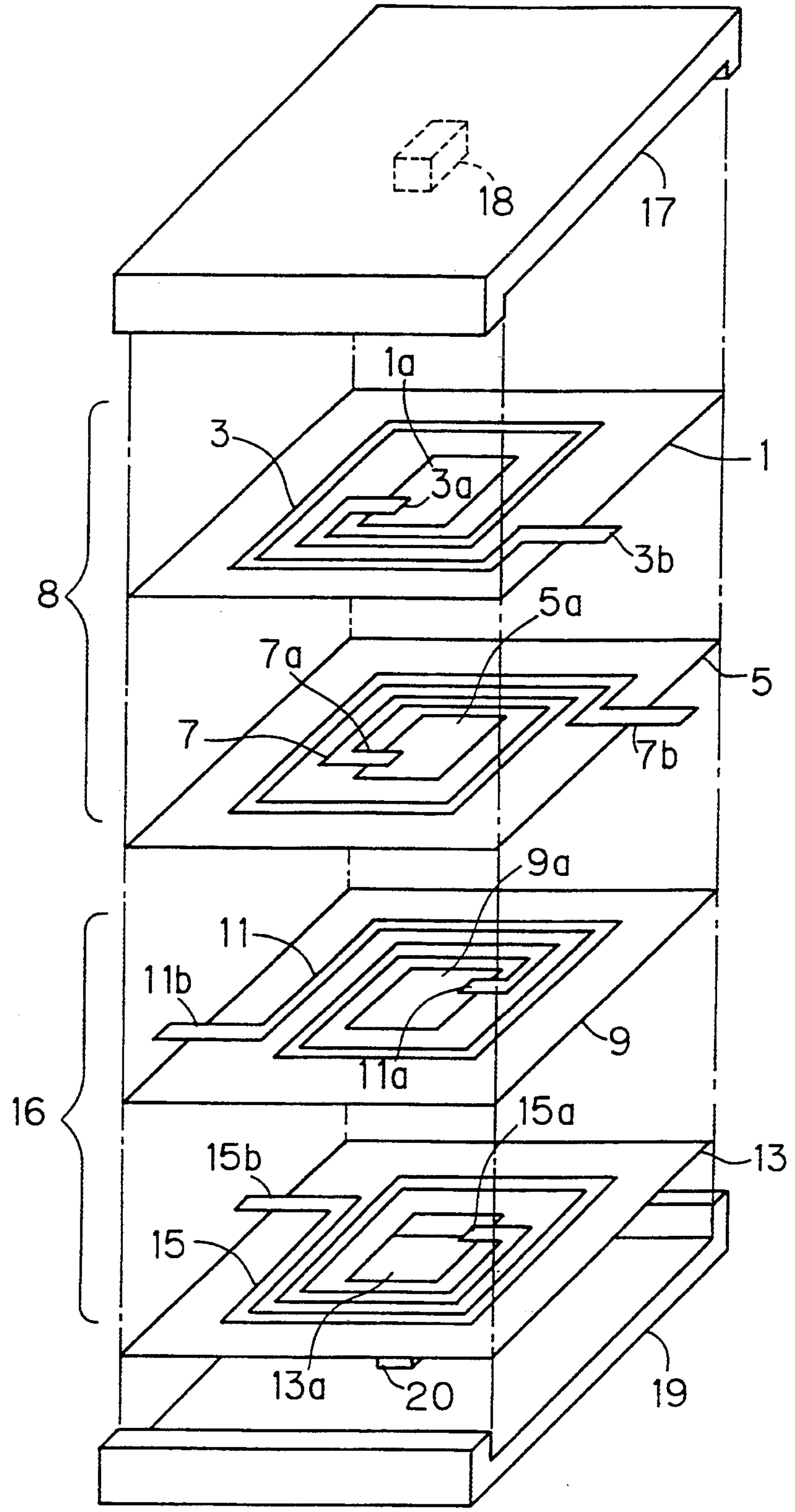
FIG. 3 is an exploded perspective view showing the layered coil according to the first embodiment of the present invention.
Figure 4:
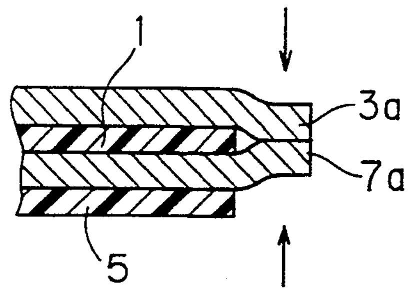
FIG. 4 illustrates a method of connecting outlet portions of coil conductors with each other.

In a similar manner to the above, insulating sheets 5, 9 and 13 which are provided with spiral coil conductors 7, 11 and 15 on surfaces thereof are obtained as shown in FIG. 3. These insulating sheets 5, 9 and 13 are provided with holes 5*a*, 9*a* and 13*a* respectively in central portions thereof. First outlet portions 7*a*, 11*a* and 15*a* of the coil conductors 7, 11 and 15, respectively project from edges of the holes 5*a*, 9*a* and 13*a* , respectively. Second outlet portions 7*b*, 11*b* and 15*b* of the coil conductors 7, 11 and 15, respectively, project from outer peripheral portions of the insulating sheets 5, 9 and 13, respectively.

The insulating sheets 1, 5, 9 and 13 are stacked with each other, so that the first outlet portions 3*a* and 7*a* of the coil conductors 3 and 7 respectively are vertically overlapped with each other, and so are the first outlet portions 11*a* and 15*a* of the coil conductors 11 and 15, respectively. The vertically overlapped outlet portions 3*a* and 7*a* are electrically connected with each other by spot welding (see FIG. 4). Thus, the coil conductors 3 and 7 define a primary coil 8. In a similar manner, the first outlet portions 11*a* and 15*a* of the coil conductors 11 and 15 respectively are connected with each other so as to define a secondary coil 16.

As shown in FIG. 3, the vertically stacked insulating sheets 1, 5, 9 and 13 are held between ferrite cores 17 and 19. The ferrite cores 17 and 19 are provided with projections 18 and 20 respectively at central portions of their lower and upper surfaces, respectively. The projections 18 and 20 pass through the holes 1*a*, 5*a*, 9*a* and 13*a* of the insulating sheets 1, 5, 9 and 13, respectively, to butt against each other. Thus, the primary and secondary coils 8 and 16 are cored.

Figure 5:
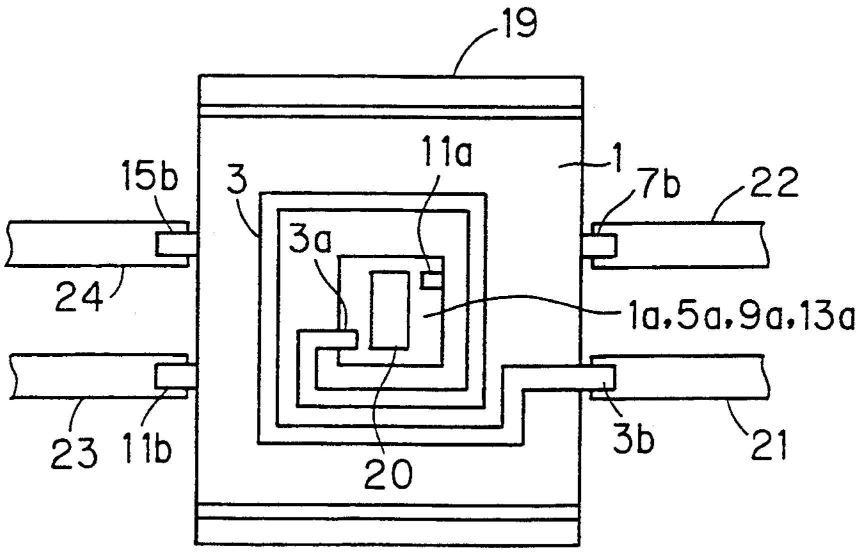
FIG. 5 is a plan view illustrating the interior of the layered coil shown in FIG. 3.
Figure 6:
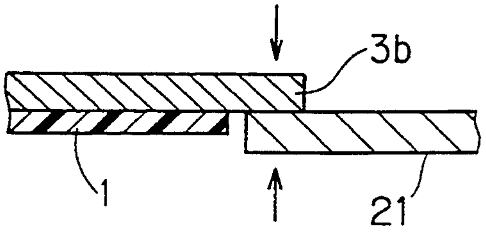
FIG. 6 illustrates a method of connecting an outlet portion of a coil conductor with a terminal.

As shown in FIG. 5, the second outlet portions 3*b*, 7*b*, 11*b* and 15*b* of the coil conductors 3, 7, 11 and 15 respectively are superposed on first ends of terminals 21, 22, 23 and 24, respectively. The second outlet portions 3*b*, 7*b*, 11*b* and 15*b* are electrically connected with the first end of terminals 21, 22, 23 and 24, respectively, by spot welding, as shown in FIGS. 5 and 6. The layered product thus formed is thereafter covered with an armoring member of resin or the like, to be completed.

In the aforementioned layered coil, the outlet portions 3*a*, 3*b*, 7*a*, 7*b*, 11*a*, 11*b*, 15*a* and 15*b* of the coil conductors 3, 7, 11 and 15 project from surfaces of the layered product, whereby the outlet portions can be easily connected with each other as well as with the terminals 21 to 24. Further, the first outlet portions 3*a* and 11*a* are connected with the first outlet portions 7*a* and 15*a* while the second outlet portions 3*b*, 7*b*, 11*b* and 15*b* are directly connected with the terminals 21, 22, 23 and 24, respectively directly by spot welding, whereby a layered coil having high connection reliability can be obtained.

Figure 7:
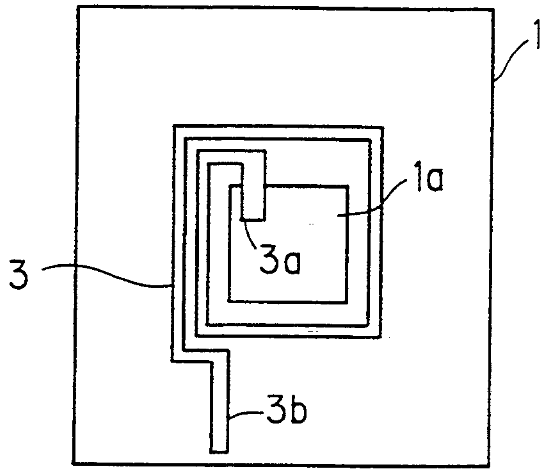
FIG. 7 is a plan view illustrating a method of preparing an insulating sheet which is employed for a layered coil according to a second embodiment of the present invention.
Figure 8:
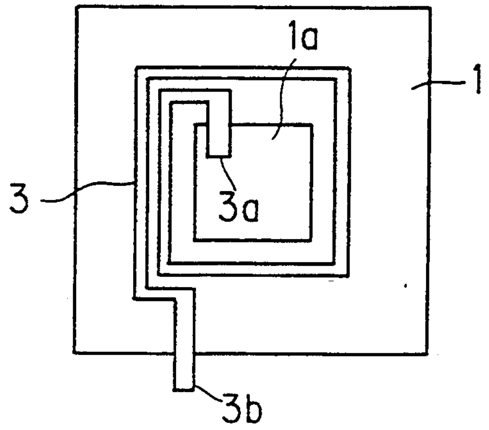
FIG. 8 is a plan view further illustrating the method of preparing the insulating sheet shown in FIG. 7.

Second Embodiment (FIGS. 7 and 8)

A layered coil according to a second embodiment of the present invention, also having a cored structure, is similar in structure to the layered coil according to the first embodiment, except for the method of forming spiral coil conductors on insulating sheets. As shown in FIG. 7, a hole 1*a* is provided in a central portion of an insulating sheet 1. A metallic sheet is stuck onto the upper surface of the insulating sheet 1 through a bonding layer, and a resist film is formed on the surface of the metallic sheet to obtain a desired spiral coil conductor. Thereafter, unnecessary portions of the metallic sheet are removed by etching. Then, the resist film is removed to obtain the insulating sheet 1 which is provided with a coil conductor 3 on its surface (FIG. 7). A first outlet portion 3*a* of the coil conductor 3 projects from an edge of the hole 1*a*, while a second outlet portion 3*b* of the coil conductor 3 is arranged on an outer peripheral portion of the insulating sheet 1. Then, the outer peripheral portion of the insulating sheet 1 is partially removed as shown in FIG. 8, so that the second outlet portion 3*b* of the coil conductor 3 projects from the outer peripheral portion of the insulating sheet 1. Such insulating sheets provided with coil conductors are stacked with each other in a similar manner to the first embodiment, thereby obtaining a layered coil.

Figure 9:
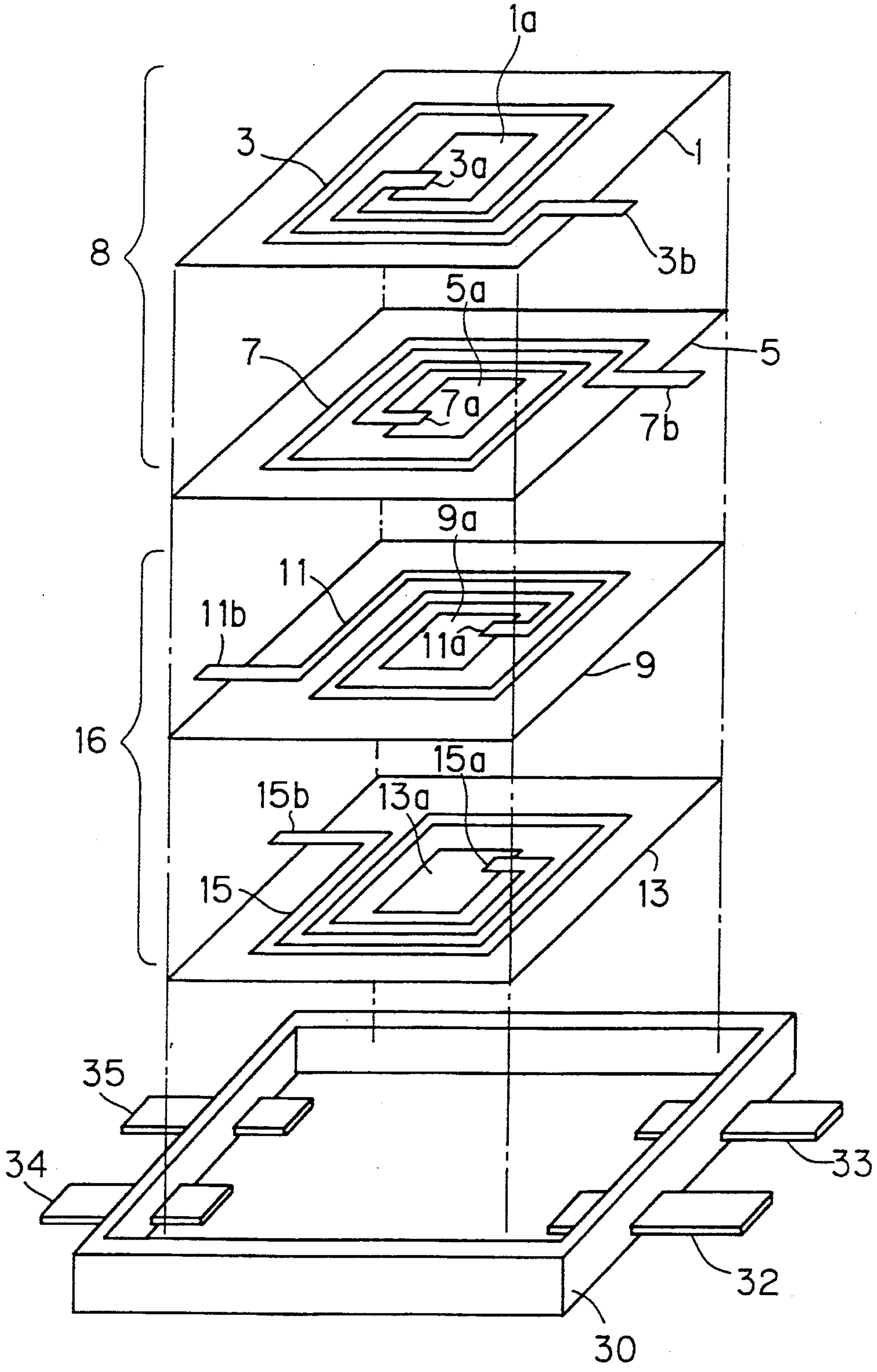
FIG. 9 is an exploded perspective view showing a layered coil according to a third embodiment of the present invention.
Figure 10:
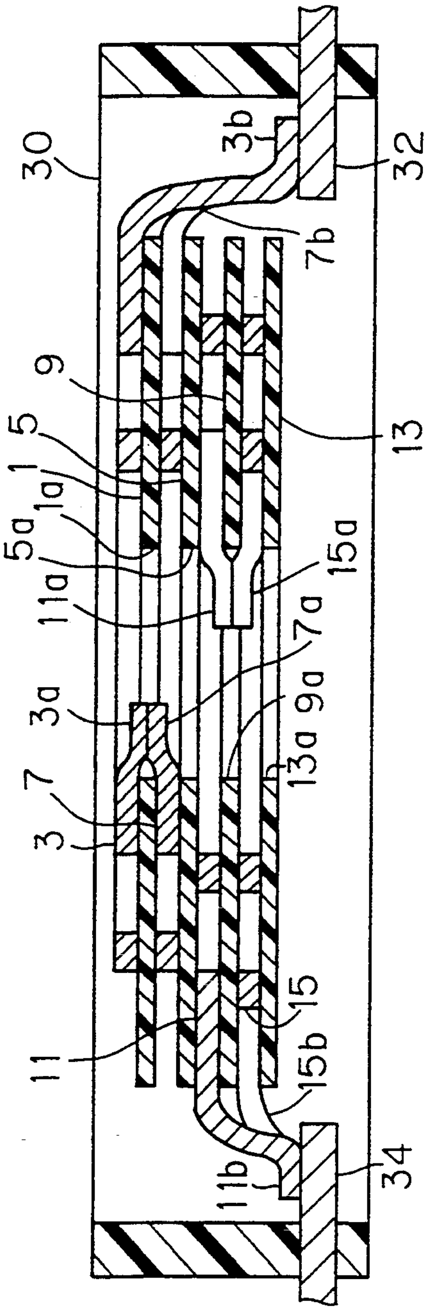
FIG. 10 is a longitudinal sectional view of the layered coil shown in FIG. 9.

Third Embodiment (FIGS. 9 and 10)

A layered coil according to a third embodiment of the present invention has an air-core structure. As shown in FIG. 9, insulating sheets 1, 5, 9 and 13 are stacked in a similar manner to the first embodiment. The stacked insulating sheets 1, 5, 9 and 13 are received in a resin frame 30, which includes pairs of terminals 34 and 35, and 32 and 33, extending from the left and right side walls, respectively. As shown in FIG. 10, first outlet portions 3*a* and 11*a* are electrically connected by spot welding with first outlet portions 7*a* and 15*a*, respectively. Similarly, second outlet portions 3*b*, 7*b*, 11*b* and 15*b* are electrically connected by stop welding with first ends of the terminals 32, 33, 34 and 35, respectively.

The layered coil according to the present invention and the method of manufacturing the same are not restricted to the aforementioned embodiments, but can be modified in various ways within the scope of the present invention.

For example, a number of coil conductors may be connected in parallel with each other in order to form a heavy-current layered coil. Similarly a number of coil conductors may be connected in series to each other in order to form a layered coil having high inductance.

The outlet portions may be connected with each other by means of soldering, caulking or the like, in place of spot welding.

On the other hand, an insulating sheet provided with a coil conductor may be prepared by a method of applying conductive paste to an insulating sheet by means such as printing to form a coil conductor and thereafter forming a hole in the central portion of the insulating sheet or removing its outer peripheral portion.

Although the various embodiments of the present invention have been described and illustrated in detail, it is clearly understood that the same is by way of illustration and example only and is not to be taken by way of limitation, the scope of the present invention being limited only by the terms of the appended claims.

What is claimed is:

1. A layered coil comprising a layered product formed by a plurality of coil conductors which are alternately arranged with a plurality of insulators, ends of said coil conductors having outlet portions, at least parts of said outlet portions projecting from surfaces of said layered product, a first outlet portion of a first coil conductor being connected with a first outlet portion of a second coil conductor, said first outlet portion of said first coil conductor being adjacent to said first outlet portion of said second coil conductor;

a terminal, one of said outlet portions of one of said plurality of coil conductors being connected with said terminal, and a case for retaining said layered product, said terminal extending from said case.

2. A layered coil in accordance with claim 1, wherein said outlet portion which is connected with said terminal projects from an outer peripheral portion of one of said plurality of insulators.

3. A layered coil in accordance with claim 1, wherein said insulators have through holes, said first outlet portions of said respective coil conductors at least partially covering open ends of said through holes.

4. A layered coil in accordance with claim 3, wherein said first outlet portions are positioned so as to overlap with each other thereby forming the respective pairs of first outlet portions which are to be connected with each other.

5. A layered coil in accordance with claim 3, further comprising a core of ferrite, a part of said core being positioned in said through holes.

6. A layered coil in accordance with claim 3, wherein said coil conductors are arranged so as to spirally extend around peripheries of said through holes of said respective insulators.

7. A layered coil in accordance with claim 1, wherein said first coil conductor is arranged so as to extend along a first direction on a surface of a first insulator and said second coil conductor is arranged to extend along a second direction, opposite to said first direction, on a surface of a second insulator.

8. A layered coil in accordance with claim 1, wherein said first outlet portion of said first coil conductor is spot welded with said first outlet portion of said second coil conductor.

9. A layered coil comprising a layered product formed by a plurality of coil conductors which are alternately arranged with a plurality of insulators, ends of said coil conductors having outlet portions, at least parts of said outlet portions projecting from surfaces of said layered product, a first outlet portion of a first coil conductor being connected with a first outlet portion of a second coil conductor, said first outlet portion of said first coil conductor being adjacent to said first outlet portion of said second coil conductor, and said insulators having through holes, said first outlet portions of said respective coil conductors projecting from peripheral portions of said through holes.

10. A layered coil in accordance with claim 9, wherein said first outlet portions are positioned so as to overlap with each other thereby forming the respective pairs of first outlet portions which are to be connected with each other.

11. A layered coil in accordance with claim 9, further comprising a core of ferrite, a part of said core being positioned in said holes.

12. A layered coil in accordance with claim 9, wherein said coil conductors are arranged so as to spirally extend around peripheries of said holes of said respective insulators.

13. A layered coil in accordance with claim 1, wherein said plurality of coil conductors are connected in series to each other.

14. A layered coil in accordance with claim 5, wherein said first coil conductor is arranged so as to extend along a first direction on a surface of a first insulator and said second coil conductor is arranged to extend along a second direction, opposite to said first direction, on a surface of a second insulator.

15. A layered coil in accordance with claim 9, wherein said first outlet portion of said first coil conductor is spot welded with said first outlet portion of said second coil conductor.

16. A layered coil in accordance with claim 9, further comprising a terminal, one of said outlet portions of one of said plurality of coil conductors being connected with said terminal.

17. A layered coil in accordance with claim 16, further comprising a case for retaining said layered product, said terminal extending from said case.

18. A layered coil in accordance with claim 16, wherein said outlet portion which is connected with said terminal projects from an outer peripheral portion of one of said plurality of insulators.

19. A layered coil in accordance with claim 9, wherein said plurality of coil conductors are connected in series to each other.

* * * * *